(12) United States Patent
Ricks et al.

(10) Patent No.: US 6,292,049 B1
(45) Date of Patent: Sep. 18, 2001

(54) CIRCUIT AND METHOD FOR REDUCING VOLTAGE OSCILLATIONS ON A DIGITAL INTEGRATED CIRCUIT

(75) Inventors: Joe A. Ricks; Carl Hernandez, both of Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/535,057

(22) Filed: Mar. 24, 2000

(51) Int. Cl.[7] .................................................. G05F 1/10
(52) U.S. Cl. ............................................................. 327/536
(58) Field of Search ...................... 326/88, 92; 327/379, 327/390, 536

(56) References Cited

U.S. PATENT DOCUMENTS 5,059,823 * 10/1991 Ahsanullah ............................ 307/443
5,473,263 * 12/1995 Mahmood ................................ 326/27
6,177,810 * 1/2001 Loeffler ................................. 326/87

* cited by examiner

*Primary Examiner*—Jeffrey Zweizig
(74) *Attorney, Agent, or Firm*—Conely, Rose & Tayon, PC; B. Noël Kivlin

(57) ABSTRACT

A circuit and method for reducing voltage oscillations at the output leads of a digital integrated circuit. A circuit for reducing voltage oscillations on the output leads of a digital integrated circuit comprising a positive voltage charge pump unit coupled to an output driver, a negative voltage charge pump unit also coupled to the output driver and a sense and control unit coupled to both the negative voltage charge pump unit and the positive voltage charge pump unit is presented. The sense and control unit is configured to determine whether switching current is present in the source or drain of the output driver. If switching current is present in the source, then the sense and control unit is further configured to connect the positive voltage charge pump unit to the source. If switching current is present in the drain, then the sense and control unit is still further configured to connect the negative voltage charge pump unit to the drain.

10 Claims, 5 Drawing Sheets

US 6,292,049 B1

CIRCUIT AND METHOD FOR REDUCING VOLTAGE OSCILLATIONS ON A DIGITAL INTEGRATED CIRCUIT

BACKGROUND OF THE INVENTION

1. Field of the Invention

This invention relates to digital integrated circuits and, more particularly, to the reduction of voltage oscillations on the output leads.

2. Description of the Related Art

Integrated circuit (IC) chips are manufactured from semi-conducting material, such as silicon or gallium arsenide. The manufacturing process starts with a slice, or wafer, of the semiconducting material. The semiconducting material goes through several process steps to fabricate millions of electrical circuits on the surface of the wafer. These circuits may be grouped and duplicated many times on the wafer. The wafer is then cut into individual groups of circuits called die. The electrical circuits are created with microscopic geometric structures which may be easily damaged if not protected. In many cases, a single die is housed in an enclosure, referred to as a package, which is designed to provide some level of protection to the circuits on the die. Although there are many types of packages, most all packages provide both physical protection and electrical connections from the exterior of the package to the electrical circuits on the surface of the semicondcutor.

There are several methods currently in use to make the electrical connections from the package to the die surface. A common method uses bonding wires. The wires are typically made from aluminum or gold. Referring to FIG. 1, one particular packaging method using a lead frame is shown. The package 30 has several external connections referred to as leads 35 or pins. Together, all of the leads form a structure internal to the package 30 known as a lead frame 40. A die 10 has several bonding areas called pads 20. At the internal end of each lead in the lead frame, there is another bonding area. The bonding areas are used to bond the bonding wires 45.

In many packaging solutions, wire bonding is the common method for making the die to lead frame connections. However, as shown in the complimentary metal oxide semiconductor (CMOS) output driver circuit 50 of FIG. 2, the bond wires have a parasitic inductance 70 per unit length between the package lead 75 and the die pad 80. There is also inductance associated with power 85 and ground 90 connections on the die.

Turning now to FIG. 2, a typical CMOS output driver is shown, including the parasitic inductances described above. When a logic value of zero is applied to input 60, P-channel transistor 51 conducts, acting like a closed switch, thus providing a path for current to flow from Vdd to the package lead. N-channel transistor 52 simultaneously stops conducting, thus acting like an open switch. This effectively drives a logic value of one on the package lead. When a logic value of one is applied to input 60, P-channel transistor 51 opens and N-channel transistor 52 closes, thus providing a path for current to flow from the package lead to circuit ground. This effectively drives a logic value of zero on the package lead. The current that flows each time an opposite logic value is applied is referred to as total switching current 99 and 94, respectively.

The inductances mentioned above can be problematic in that they may cause voltage spikes and oscillations proportional to the magnitude of the total switching current 99 or 94 that flows through the inductance. This is shown by the equation, V=L di/dt. In FIG. 3, the output voltage of CMOS output driver 50 is plotted on the vertical axis and time is plotted on the horizontal axis. The oscillation problem is shown as the logic level switches from a logic one to a logic zero. The voltage oscillating or ringing around zero volts immediately following the voltage transition causes ground bounce 100. A similar condition occurs as a result of a transition from a logic zero to a logic one. The ringing around the Vdd voltage level causes a voltage sag. Although the description of FIG. 1 above is an example of a particular packaging method, it is noted that digital ICs using other packaging methods, such as Ball Grid Array (BGA) packages, may exhibit voltage ringing problems.

In the past, package improvements were made to reduce the package related parasitic inductances. However, as signal frequencies increase, the amount of inductance remaining in improved package designs and the power and ground connection inductance is still problematic. Further package improvements can be costly. Therefore, it is desirable to reduce the effects associated with the parasitic inductance present in packages and power and ground connections without adding additional package costs to a design.

SUMMARY OF THE INVENTION

The problems outlined above may in large part be solved by a circuit and method for reducing voltage oscillations at the output leads of a digital integrated circuit. In one embodiment, a circuit comprising a positive voltage charge pump unit coupled to an output driver, a negative voltage charge pump unit also coupled to the output driver and a sense and control unit coupled to both the negative voltage charge pump unit and the positive voltage charge pump unit is presented.

In one embodiment, the output driver may include a P-channel and an N-channel transistor. The transistors may be configured such that the gates of the transistors are connected together. The drain of the P-channel transistor is connected to the source of the N-channel transistor in a traditional CMOS inverter configuration. The source of the P-channel transistor is connected to Vdd and the drain of the N-channel transistor is connected to circuit ground.

In a preferred embodiment, the sense and control unit may be configured to determine whether switching current is present in the source or drain of the CMOS output driver. If switching current is present in the source, then the sense and control unit is further configured to connect the positive voltage charge pump unit to the source. If switching current is present in the drain, then the sense and control unit is still further configured to connect the negative voltage charge pump unit to the drain. Connecting the negative voltage charge pump unit to the drain of the N-channel transistor or connecting the positive voltage charge pump unit to the source of the P-channel transistor may advantageously reduce the voltage oscillations present at the output of the CMOS output driver, which are caused by switching currents present during transitions from logic one to logic zero or logic zero to logic one.

BRIEF DESCRIPTION OF THE DRAWINGS

Other objects and advantages of the invention will become apparent upon reading the following detailed description and upon reference to the accompanying drawings in which.

Figure 1:
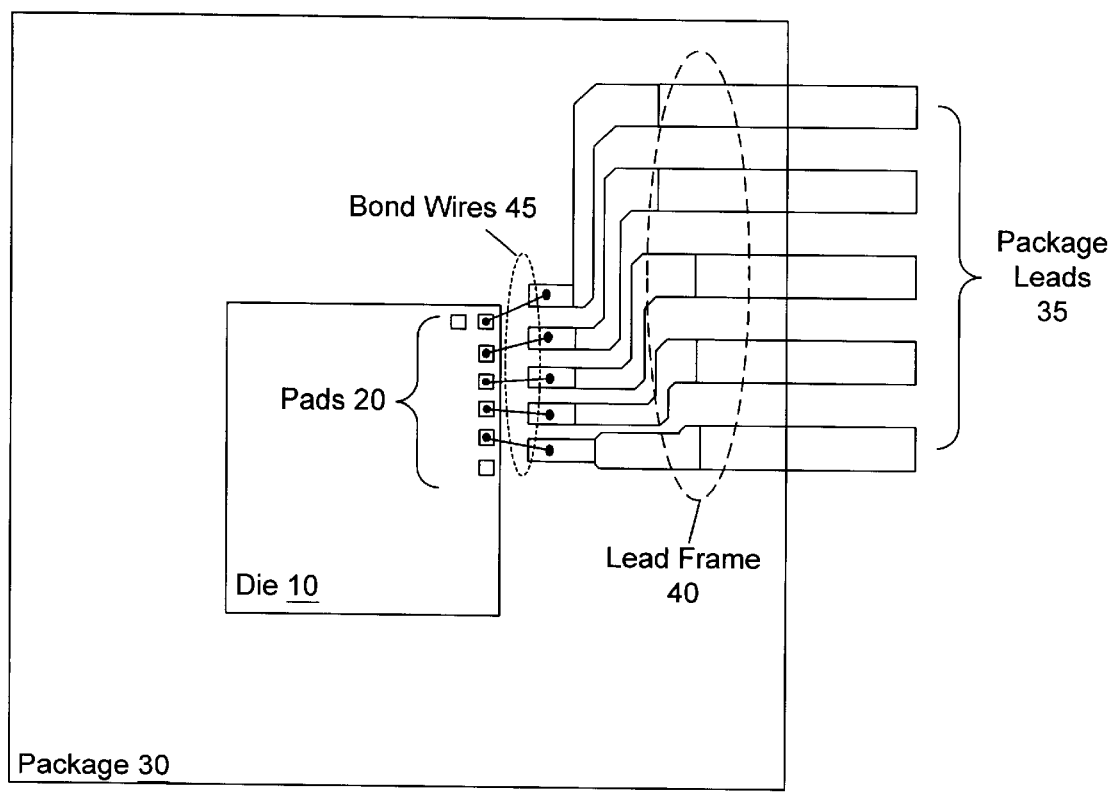
FIG. 1 is a diagram of an integrated circuit package showing bond wire and lead frame connections which are well known in the industry and considered prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
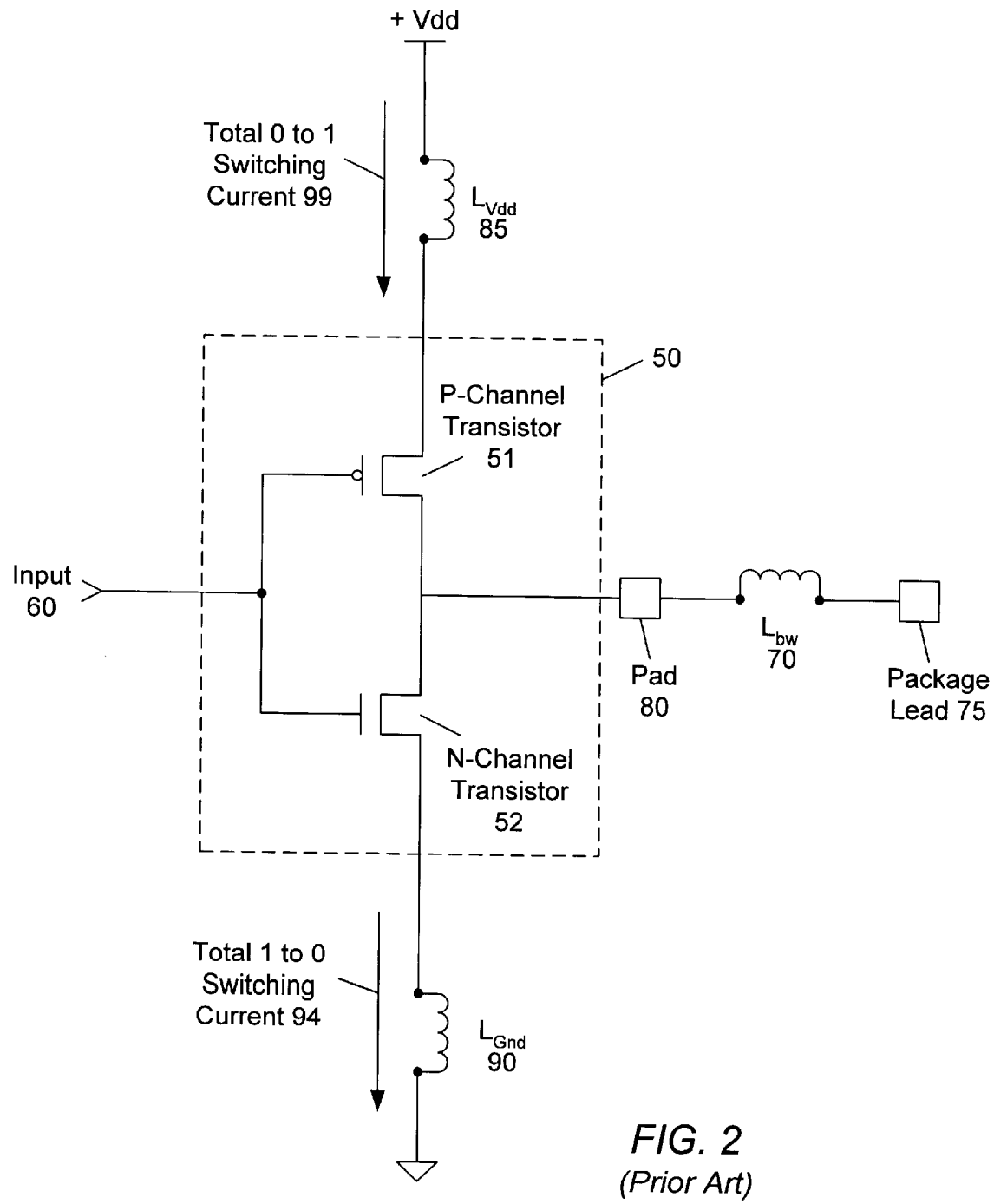
FIG. 2 is a schematic drawing of one embodiment of an output driver circuit of a digital integrated circuit which is well known in the industry and is considered prior art.
Figure 4:
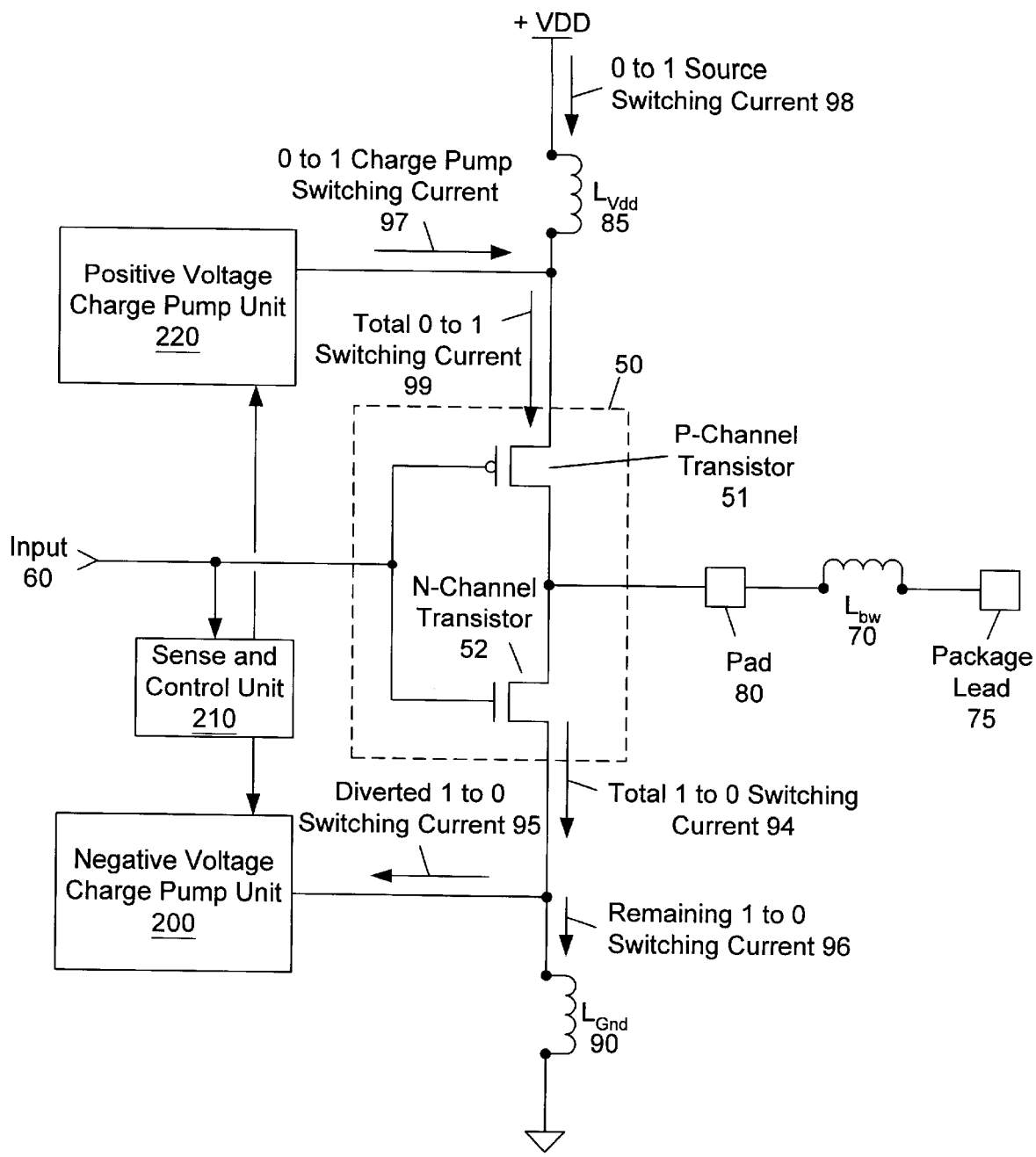
FIG. 4 is an embodiment of a circuit for reducing voltage oscillations on a digital integrated circuit.

Referring now to FIG. 4, one embodiment of a circuit for reducing voltage oscillations on a digital IC is shown. Circuit components that correspond to those shown in FIG. 2 are numbered identically for simplicity and clarity. The CMOS output driver circuit 50 of FIG. 2 is shown with the addition of a negative voltage charge pump unit 200 coupled to the drain of CMOS output driver 50 and a positive voltage charge pump unit 220 coupled to the source of CMOS output driver 50. CMOS output driver 50 includes a P-channel transistor 51 and an N-channel transistor 52. A sense and control unit 210 is coupled to an input 60 of CMOS output driver 50 and to both the negative voltage charge pump unit 200 and positive voltage charge pump unit 220.

As described in the background of FIG. 2, the total switching current 95 that flows through the parasitic inductances induces ground bounce and voltage sag. The illustration in FIG. 4 shows a method to reduce the amount of switching current that flows through the parasitic inductance associated with the ground connection and the Vdd connection of CMOS output driver 50. Negative voltage charge pump unit 200 is connected at the drain of CMOS output driver 50 and positive voltage charge pump 220 is connected at the source of CMOS output driver 50.

Figure 3:
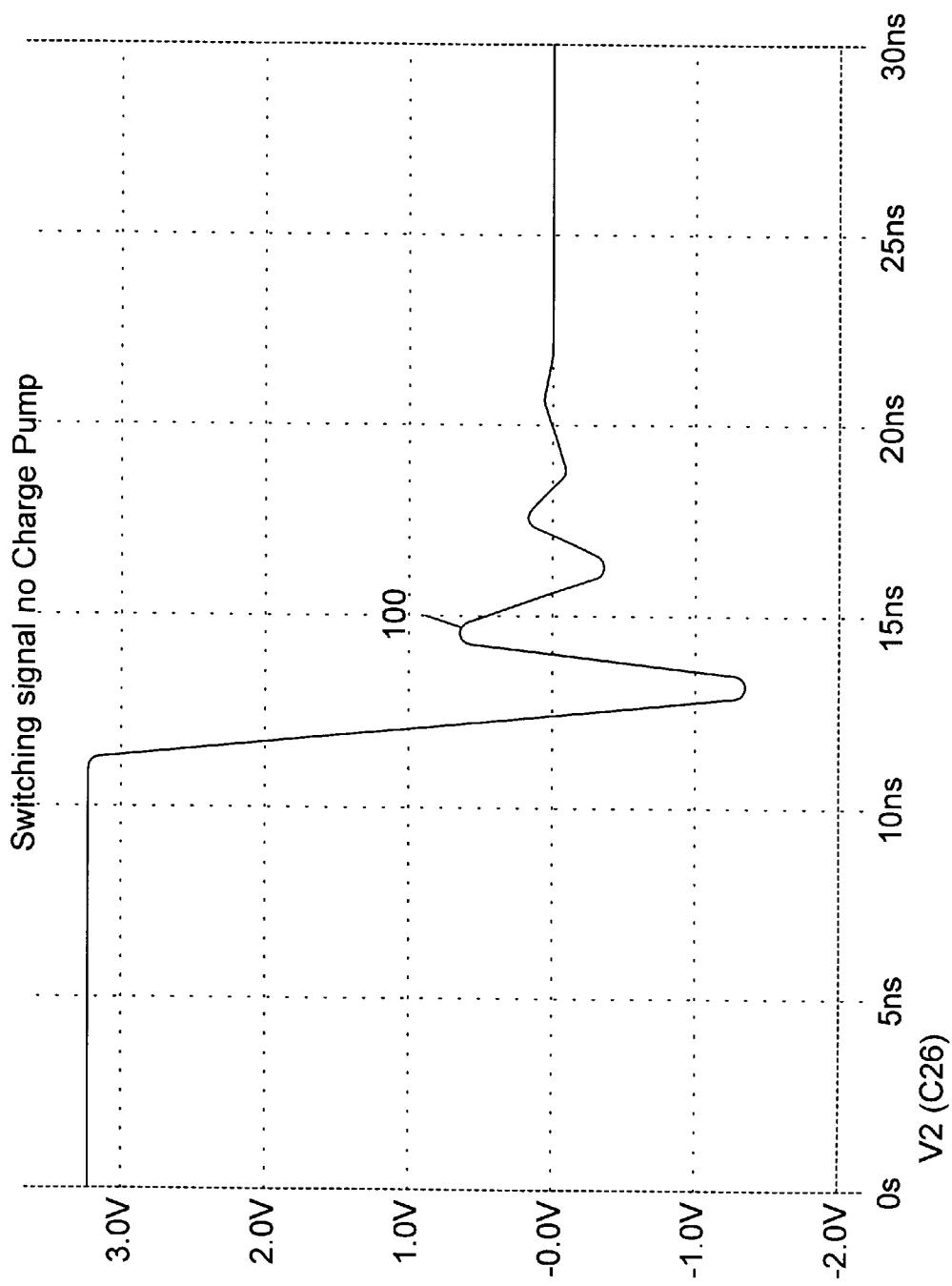
FIG. 3 is an output waveform showing voltage oscillation from the output of the output driver of the circuit of FIG. 2 and is considered prior art.

Negative voltage charge pump unit 200 is configured to develop a negative voltage with respect to circuit ground. Sense and control unit 210 senses what logic values are applied to input 60. When a logic one to logic zero transition is detected, sense and control unit 210 causes the negative voltage developed by negative voltage charge pump unit 200 to be connected to the drain of CMOS output driver 50. This negative voltage presents a lower potential than circuit ground to the total switching current 95 that flows during a logic one to logic zero transition. This lower potential effectively diverts some of the total switching current, thereby reducing the switching current in the parasitic inductance associated with the circuit ground connection. As shown below in FIG. 5, the lower switching current in the inductor induces a smaller oscillation of the output voltage of the CMOS output driver 50 than that shown in FIG. 3, thereby reducing the ground bounce on the package lead.

Positive voltage charge pump unit 220 is configured to develop a positive voltage, which is more positive than Vdd, with respect to circuit ground. Sense and control unit 210 senses what logic values are applied to input 60. When a logic zero to logic one transition is detected, sense and control unit 210 causes the positive voltage developed by positive voltage charge pump unit 220 to be connected to the source of CMOS output driver 50. This positive voltage presents a higher potential than the Vdd source and causing the positive voltage charge pump unit 220 to also be a source, but with less current capacity than the Vdd source. Therefore, the total switching current 99 that flows during a logic zero to logic one transition is provided by Vdd and positive voltage charge pump unit 220, thereby effectively bypassing the parasitic inductance associated with the Vdd connection with some of the current. The current that does flow through the parasitic inductance associated with the Vdd connection is reduced and therefore the voltage sag is also reduced.

Figure 5:
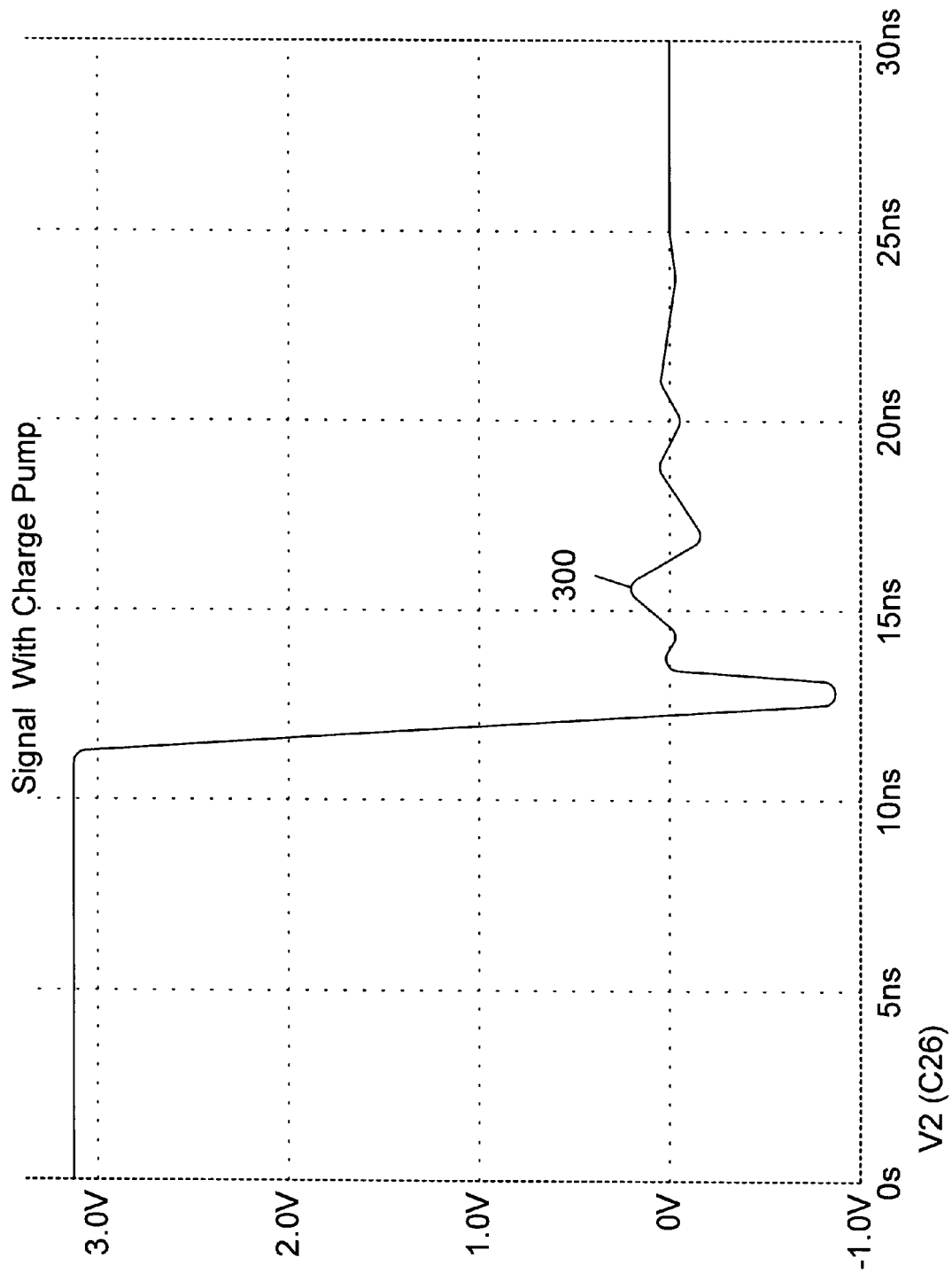
FIG. 5 is an output waveform of the output voltage of the circuit of FIG. 4 during a transition from a logic one to a logic zero.

Turning now to FIG. 5, a graph of the output voltage of the circuit of FIG. 4 during a transition from a logic one to a logic zero is shown. The output voltage is plotted on the vertical axis and time is plotted on the horizontal axis. In contrast to FIG. 3, the ringing voltage or ground bounce 300 following the logic one to logic zero transition is reduced.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   an output driver including an output node, an input node, a positive voltage supply node for receiving a positive voltage supply and a ground node, wherein said ground node is coupled to a ground reference, and wherein said output driver is configured to charge said output node in response to a first input voltage being provided to said input node and to discharge said output node in response to a second input voltage being provided to said input node;
   a positive voltage charge pump unit coupled to said positive voltage supply node and configured to provide a third voltage which is more positive than said positive voltage supply;
   a negative voltage charge pump unit coupled to said ground node and configured to provide a fourth voltage which is negative with respect to said ground reference; and
   a sense and control unit coupled to said input node, said negative voltage charge pump unit and said positive voltage charge pump unit, wherein said sense and control unit is configured to detect said first input voltage and said second input voltage;
   wherein said sense and control unit is configured to selectively connect said third voltage to said positive voltage supply node in response to detecting said first input voltage and to connect said fourth voltage to said ground node in response to detecting said second input voltage.

2. The circuit as recited in claim 1, wherein said sense and control unit is further configured to connect one of said third voltage or said fourth voltage to said output driver at a time.

3. The circuit as recited in claim 1, wherein said first input voltage represents a logic level of zero.

4. The circuit as recited in claim 3, wherein second input voltage represents a logic level of one.

5. The circuit as recited in claim 1, wherein said output driver further includes a P-channel transistor and an N-channel transistor.

6. A method for controlling oscillations at an output of an integrated circuit having an output driver including a positive voltage charge pump unit, a negative voltage charge pump unit, and a sense and control unit, said method comprising:

charging an output node of said output driver in response to a first input voltage being provided to an input node of said output driver;

discharging said output node of said output driver in response to a second input voltage being provided to said input node of said output driver;

generating a third voltage which is more positive than a positive voltage supply with respect to ground;

generating a fourth voltage which is negative with respect a ground reference;

determining whether said first input voltage is being provided to said input node or said second input voltage is being provided to said input node;

connecting said third voltage to a positive voltage supply node of said output driver in response to said first input voltage being provided to said input node;

connecting said fourth voltage to a ground node of said output driver in response to said second input voltage being provided to said input node.

7. The method as recited in claim 6 further comprising connecting one of said third voltage or said fourth voltage to said output driver at a time.

8. The method as recited in claim 6, wherein said first input voltage represents a logic level of zero.

9. The method as recited in claim 8, wherein second input voltage represents a logic level of one.

10. The method as recited in claim 8, wherein said output driver further includes a P-channel transistor and an N-channel transistor.

\* \* \* \* \*